United States Patent
Torvik

(10) Patent No.: US 7,112,515 B2
(45) Date of Patent: Sep. 26, 2006

(54) METHOD OF MAKING A HYBRID SUBSTRATE HAVING A THIN SILICON CARBIDE MEMBRANE LAYER

(75) Inventor: John Targe Torvik, Louisville, CO (US)

(73) Assignee: Astralux, Inc., Boulder, CO (US)

( * ) Notice: Subject to any disclaimer, the term of this patent is extended or adjusted under 35 U.S.C. 154(b) by 268 days.

(21) Appl. No.: 10/761,490

(22) Filed: Jan. 20, 2004

(65) Prior Publication Data

US 2004/0171230 A1   Sep. 2, 2004

Related U.S. Application Data

(63) Continuation of application No. 10/086,016, filed on Feb. 28, 2002, now Pat. No. 6,699,770.

(60) Provisional application No. 60/272,532, filed on Mar. 1, 2001.

(51) Int. Cl.
*H01L 21/30* (2006.01)
*H01L 21/46* (2006.01)

(52) U.S. Cl. ..................................... 438/459

(58) Field of Classification Search .................. 438/459
See application file for complete search history.

(56) References Cited

U.S. PATENT DOCUMENTS

| | | | |
|---|---|---|---|
| 4,352,724 A | 10/1982 | Sugishima et al. | |
| 5,250,460 A | 10/1993 | Yamagata et al. | |
| 5,374,564 A | 12/1994 | Bruel | |
| 5,453,394 A * | 9/1995 | Yonehara et al. | 438/455 |
| 5,466,631 A * | 11/1995 | Ichikawa et al. | 438/406 |
| 5,543,648 A | 8/1996 | Miyawaki | |
| 5,710,057 A | 1/1998 | Kenney | |
| 5,798,293 A | 8/1998 | Harris | |
| 5,863,830 A | 1/1999 | Bruel et al. | |
| 5,877,070 A | 3/1999 | Goesele et al. | |
| 5,882,532 A | 3/1999 | Field et al. | |
| 5,882,987 A | 3/1999 | Srikrishnan | |
| 5,920,764 A | 7/1999 | Hanson et al. | |
| 5,965,918 A | 10/1999 | Ono | |
| 5,966,620 A | 10/1999 | Sakaguchi et al. | |

(Continued)

OTHER PUBLICATIONS

B. Aspar, "Transfer of Structured and Patterned Thin Silicon FilmC Using the Smart_Cut Process," *Electronics Letters* (Oct. 1996), pp. 1985-1986.

*Primary Examiner*—David S. Blum
(74) *Attorney, Agent, or Firm*—Sheridan Ross P.C.

(57) ABSTRACT

A hybrid semiconductor substrate assembly is made by first forming a silicon oxide ($SiO_x$) layer within a silicon carbide wafer, thus forming a silicon carbide membrane on top of the silicon oxide layer and on a surface of the silicon carbide wafer. Optionally, the silicon oxide layer is then thermally oxidized in the presence of steam or oxygen. A substrate-of-choice is then wafer bonded to the silicon carbide membrane, optionally in the presence of a wetting layer that is located intermediate the substrate-of-choice and the silicone carbide membrane, the wetting layer containing silicon. The silicon oxide layer is then removed by hydrofluoric acid etching, to thereby provide a hybrid semiconductor substrate assembly that includes the substrate-of-choice wafer bonded to the silicon carbide membrane. The hybrid semiconductor substrate assembly is then annealed. The method is repeated a plurality of times, to thereby provide a plurality of hybrid semiconductor substrate assemblies, each assembly including a substrate-of-choice wafer bonded to a silicon carbide membrane. Optionally, an annealing step may be provided after the silicon oxide layer is formed and prior to wafer bonding.

20 Claims, 4 Drawing Sheets

U.S. PATENT DOCUMENTS

| | | | |
|---|---|---|---|
| 6,027,988 A * | 2/2000 | Cheung et al. | 438/513 |
| 6,054,370 A | 4/2000 | Doyle | |
| 6,084,271 A | 7/2000 | Yu et al. | |
| 6,103,598 A | 8/2000 | Yamagata et al. | |
| 6,120,597 A | 9/2000 | Levy et al. | |
| 6,143,628 A | 11/2000 | Sato et al. | |
| 6,261,928 B1 | 7/2001 | Bruel | |
| 6,284,631 B1 | 9/2001 | Henley et al. | |
| 6,500,732 B1 | 12/2002 | Henley | |
| 2003/0008475 A1 * | 1/2003 | Cheung et al. | 438/455 |

* cited by examiner

METHOD OF MAKING A HYBRID SUBSTRATE HAVING A THIN SILICON CARBIDE MEMBRANE LAYER

CROSS-REFERENCE TO RELATED APPLICATIONS

The present application is a continuation of U.S. patent application Ser. No. 10/086,016, filed Feb. 28, 2002 now U.S. Pat. No. 6,699,770 entitled METHOD OF MAKING A HYBRID SUBSTRATE HAVING A THIN SILICON CARBIDE MEMBRANE LAYER to Torvik, which claims priority from pending provisional patent application Ser. No. 60/272,532 filed Mar. 1, 2001, entitled LARGE AREA HYBRID SiC WAFERS, each of which is incorporated herein by this reference.

BACKGROUND OF THE INVENTION

1. Field of the Invention

This invention relates to the field of semiconductor substrate manufacture; i.e., a substrate on which semiconductor materials or devices can be formed.

2. Description of the Related Art

The present invention makes use of a separation by implantation of oxygen (SIMOX) process.

In accordance with this invention, a SIMOX process provides that oxygen implanter apparatus is used to create a very thin silicon dioxide ($SiO_2$, $SiO_x$) layer that is buried within a relatively thick silicon carbide (SiC) wafer, thereby leaving a thin membrane layer of SiC on top of the SiC wafer. For example, such oxygen implantation equipment is manufactured by Ibis Technology Corporation.

The present invention uses a step of etching $SiO_2$ ($SiO_x$) in hydrofluoric acid.

The present invention uses a wafer-bonding step. Wafer bonding of a variety of materials is known.

U.S. Pat. No. 5,798,293, incorporated herein by reference, is cited for its teaching of the production of a semiconductor layer of SiC of the 3C polytype on top of a semiconductor substrate layer using a wafer-bonding technique.

U.S. Pat. No. 5,877,070, incorporated herein by reference, is cited for its teaching of transferring an upper portion of a first mono-crystalline substrate to a second substrate using hydrogen trap-induced implantation of the first substrate, forming micro-cracks in the hydrogen traps, direct wafer bonding the first substrate to the second substrate, and growing the micro-cracks such that the upper portion of the first substrate separates from the first substrate.

U.S. Pat. No. 5,966,620, incorporated herein by reference, is cited for its teaching of the use of the implantation of helium ions or hydrogen ions into a single crystal silicon substrate in order to form micro-cavities in the implantation region. Separation is achieved due to the fragility of the implantation region, and by the application of an external force, by oxidation of the implantation layer, or by laser heating of the implantation layer.

U.S. Pat. No. 6,054,370, incorporated herein by reference, is cited for its teaching of the formation of first damaged regions in a substrate underneath areas wherein active devices are formed forming second damaged areas in the substrate at locations between the first damaged regions, causing a film to detach from the substrate at locations where the first and second damaged regions are formed, and transferring the film to a wafer.

U.S. Pat. No. 6,120,597, incorporated herein by reference, is cited for its teaching of the detaching of a single crystal film from an epilayer/substrate or bulk crystal structure wherein ions are implanted into the crystal structure to form a damaged layer within the crystal structure at an implantation depth below a top surface of the crystal structure, and wherein chemical etching effects detachment of the single crystal film from the crystal structure.

SUMMARY OF THE INVENTION

This invention provides for the fabrication of hybrid substrates wherein a thin membrane of SiC is lifted off or sliced from a relatively thick SiC wafer, and wherein the thin SiC membrane is wafer bonded to the surface of a substrate-of-choice, to thereby form a hybrid substrate that is made up of the thin membrane of SiC and the substrate-of-choice.

While the invention will be described relative to the use of a relatively thick SiC wafer within the spirit and scope of the invention such a semiconductor wafer can be selected from SiC polytypes, non-limiting examples being 6H—SiC, 4H—SiC, 3C—SiC and 15R—SiC.

Use of the relatively thick and expensive SiC wafer is maximized since many thin SiC membranes can be produced from one thick SiC wafer. That is, the thick and expensive SiC wafer can be re-used to form a number of thin SiC membranes wherein the now-exposed surface of the relatively thick SiC wafer is polished before the next thin SiC membrane is, removed from the thick SiC wafer.

Wafer bonding of the SiC membrane to the substrate-of-choice is performed using commercially-available substrates-of-choice. In this manner, the invention provides relatively inexpensive hybrid SiC substrates.

An embodiment of the invention includes a three-step process. In this three-step process, a buried $SiO_2$ layer, or more generally a $SiO_x$ layer, is first formed in a relatively thick SiC wafer by oxygen implantation at an elevated temperature thereby forming a thin SiC membrane on top of the buried $SiO_2$ layer.

Secondly, the exposed surface of the thin SiC membrane is wafer bonded to the surface of a substrate-of-choice; for example, to a silicon (Si), or a polycrystalline SiC substrate. Optionally, a wetting/bonding layer can be provided between the two wafer-bonding surfaces. Non-limiting examples of such a wetting/bonding layer are layers that contain silicon, such as silicon nitride ($Si_3N_4$).

Thirdly, the thin SiC membrane is separated from the relatively thick SiC wafer; for example, by using a hydrofluoric acid etching step to remove the buried $SiO_2$ ($SiO_x$) layer.

BRIEF DESCRIPTION OF THE DRAWINGS

FIGS. 1A, 1B and 1C show a three-step process by which hybrid substrates having a thin SiC membrane are produced in accordance with the invention, wherein FIG. 1A shows a buried $SiO_2$ ($SiO_x$) layer that is formed within a SiC wafer by oxygen implantation, thereby leaving a top disposed and thin SiC membrane, FIG. 1B shows a substrate-of-choice that has been wafer bonded to the top and exposed surface of the thin SiC membrane, and FIG. 1C shows that the thin SiC membrane has been lifted off, removed from, sliced from, or separated from, the top of the SiC wafer by etching SiC wafer 11 in hydrofluoric acid, the result being a thin SiC membrane that is wafer bonded onto the substrate-of-choice.

DESCRIPTION OF THE PREFERRED EMBODIMENT

Figure 1A:
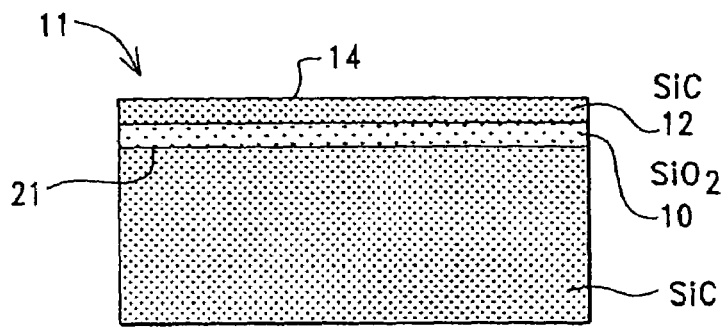

With reference to FIG. 1A in accordance with the invention a buried $SiO_2$ or $SiO_x$ layer 10 (hereinafter $SiO_2$) is formed in a SiC wafer 11 by oxygen implantation, thereby leaving a top disposed and thin SiC membrane 12 that is, for example, about one micrometer thick or less. The oxygen implantation step of FIG. 1A is usually performed at a high temperature; for example, from about 600 to about 700 degrees centigrade.

As a feature of the invention, a thermal oxidation step may be provided, for example at a temperature about 1150 degrees centigrade and in steam (wet oxidation) or in dry oxygen (dry oxidation), in order to grow $SiO_2$ layer 10, thereby redistributing and smoothening the bond interface that exists between $SiO_2$ layer 10 and SiC membrane 12.

Figure 1B:
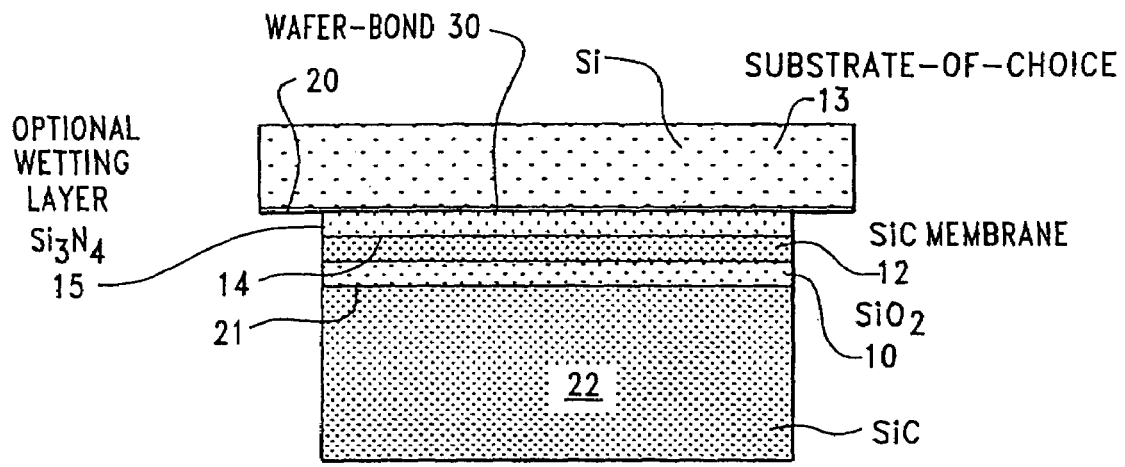

In FIG. 1B, a substrate-of-choice 13, for example a silicon (Si) substrate 13, is wafer bonded to the top, polished, and exposed surface 14 of thin SiC membrane 12. FIG. 1B shows an optional $Si_3N_4$ wetting layer 15 that can be provided between the top surface 14 of thin SiC membrane 12 and the bottom surface 20 of substrate-of-choice 13 prior to wafer bonding.

As used herein, the term wafer bonding is intended to mean a method of securely bonding two materials together that may have incompatible growth and processing technologies, wherein two polished and flat surfaces of almost any material are brought into physical contact so as to be locally attracted to each other by van der Waals forces, thus resulting in the bonding of the two polished and flat surfaces. In practice, wafer-bonding processes often requires an elevated temperature, a controlled atmosphere, and an elaborate surface cleaning procedure. Usually, the wafer-bonding process is performed in a clean environment to avoid particle contamination between the two flat bonding surfaces since contamination can cause unbonded surface areas to occur. After physically contacting the two polished and flat surfaces, bonding usually begins in one surface location, typically after applying a slight pressure. The bonded surface area then spreads laterally over the area of the two contacting surfaces within a few seconds, generally independent of wafer thickness and distance from the rim of the wafer. Compression and liquid surface tension helps the two surfaces conform to each other, thus assuring good contact even when the individual contacting surfaces are slightly non-parallel. Crystallites within the two contacting surface can fuse together at elevated temperatures due to surface energy induced migration, or due to the formation of bonds between the surface species (i.e., Si—C or Si—Si, when bonding SiC to Si). In a nonlimiting embodiment of the invention wafer-bonding was performed at a temperature of from about 500 to about 1000 degrees, in the presence of an uniaxial pressure, and in the presence of a forming gas such as a mixture of hydrogen and nitrogen.

In the process step of FIG. 1B, the intermediate wetting/bonding layer 15 that contains silicon ($Si_3N_4$) may be provided, if desired, to improve the strength of the wafer bonding of substrate-of-choice 13 to SiC membrane 12.

Figure 1C:
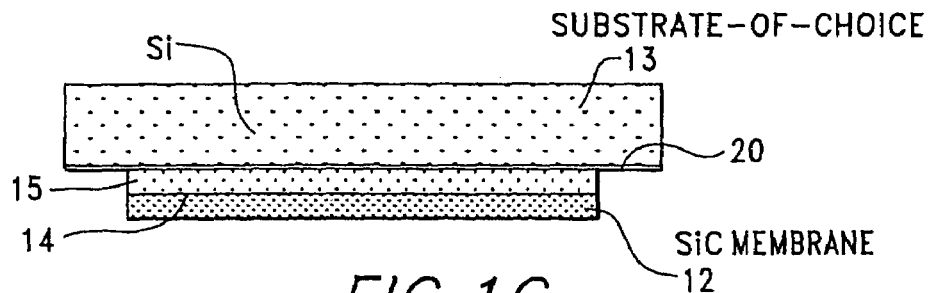

In the process step of FIG. 1C, the thin SiC membrane 12 has been lifted off, or separated from, the top of FIG. 1A SiC wafer 11 by etching $SiO_2$ layer 10 in hydrofluoric acid. The result is a thin SiC membrane 12 that is wafer bonded onto the surface 20 of substrate-of-choice 13. As a feature of the invention, a high temperature annealing step may be provided for the substrate assembly 12, 13.

A final Chemical Mechanical Polishing (CMP) step may now be performed on the now-exposed top surface 21 of relatively thick wafer 22.

Substrate-of-choice 13 is selected in accordance with an end user application in order to optimize the electrical properties, the thermal conductivities, and/or the insulating properties of substrate-of-choice 13 in accordance with the application. Applications where this invention finds utility include large-area substrates-of-choice 13 for use in RF applications (insulating substrates), near DC power and optical devices (conducting substrates), and for use as seeds for large-diameter boule growth. As will be appreciated, the choices for substrate-of-choice 13 can vary widely for different applications.

Substrate-of-choice 13 for SiC epitaxial growth requires mechanical stability and the ability to withstand temperatures as high as 1700° C. The use of polycrystalline SiC, sapphire, polycrystalline or crystalline AlN for applications requiring semi-insulating properties, and diamond and polycrystalline SiC for applications requiring conducting properties, are suggested for substrate-of-choice 13.

Substrate-of-choice 13 selections for III-V nitride growth require mechanical stability and the ability to withstand temperatures as high as 1100° C. The use of polycrystalline SiC, silicon oxide and silicon nitride for applications requiring semi-insulating properties, and silicon for applications requiring conducting properties, are suggested for substrate-of-choice 13.

Substrate-of-choice 13 selections for use in seeding SiC boule growth include crystalline SiC membranes bonded to polycrystalline SiC.

Substrate-of-choice 13 selections for thermal considerations include polycrystalline SiC and diamond.

Figure 2A:
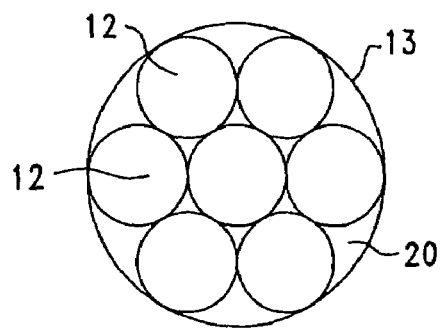
FIG. 2A shows how a number of thin and circular SiC membranes are wafer bonded onto the surface of a circular substrate of choice.
Figure 2B:
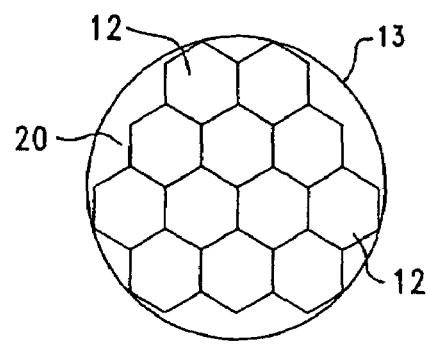
FIG. 2B shows how a number of thin and hexagonally-shaped SiC membranes are wafer bonded onto the surface of a circular substrate-of-choice.
Figure 2C:
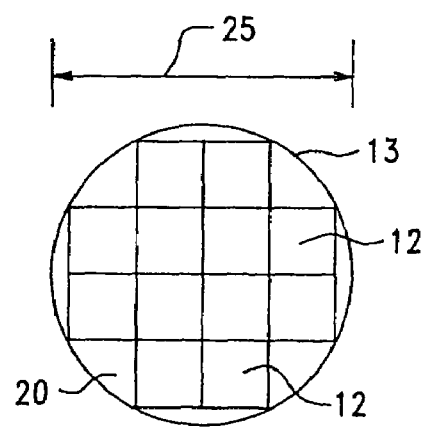
FIG. 2C shows how a number of thin and four-sided SiC membranes are wafer bonded onto the surface of a circular substrate-of-choice.

There are several ways to scale the diameter 25 of substrate-of-choice 13 by wafer bonding a number of thin SiC membranes 12 to each substrate-of-choice 13, as is illustrated by FIGS. 2A, 2B and 2C, wherein SiC membranes 12 are of a circular shape in FIG. 2A, SiC membranes 12 are of a hexagonal shape in FIG. 2B, and SiC membranes 12 are a square shape in FIG. 2C. In these figures, the diameter 20 of substrate-of-choice 13 is, for example, about 6 inches.

The present invention provides for the making of large area SiC membranes 12 that also have utility as seeds for use in boule growth. In this utility, SiC membranes 12 can be provided that are as much as 3 times larger diameter-than is available using known SiC boule seed technology. In this utility, it is desirable that membranes 12 be provided that are thicker than the above-mentioned example of about one micrometer thick or less.

With reference to FIG. 1A, and in accordance with an embodiment of the invention, a 4H—SiC wafer 11 was first ion-implanted with oxygen at 1.5 MeV and 700° C., thus providing a buried $SiO_x$ layer 10 that was about 1 μm below the top surface 14 of the 4H—SiC wafer 11. The SiC membrane maintained good crystalline quality as was determined by the use of a Rutherford Backscattering Spectroscopy.

Second, a highly-reproducible wafer-bonding process provided direct wafer bonding of the top surface 14 of the 4H—SiC membrane 12 to either a conducting (Si) or an insulating (SiO$_2$) substrate-of-choice 13. A strong bond and a good electrical interface was observed at the wafer-bonded interface 30 between 4H—SiC membrane 12 and substrate-of-choice 13.

Third, an efficient acid etch lift-off process provided that thin 4H—SiC membrane 12 was separated from the remainder 22 of the 4H—SiC wafer 11, as the separated 4H—SiC membrane 12 remained bonded to the Si or SiO$_2$ substrate-of-choice 13. Good reproducibility and high yield were obtained.

Size scaling of the above process was demonstrated using 3C—SiC to form wafer 11 to thereby provide sizes of membrane 12 up to about 2×2 cm.

Figure 3A:
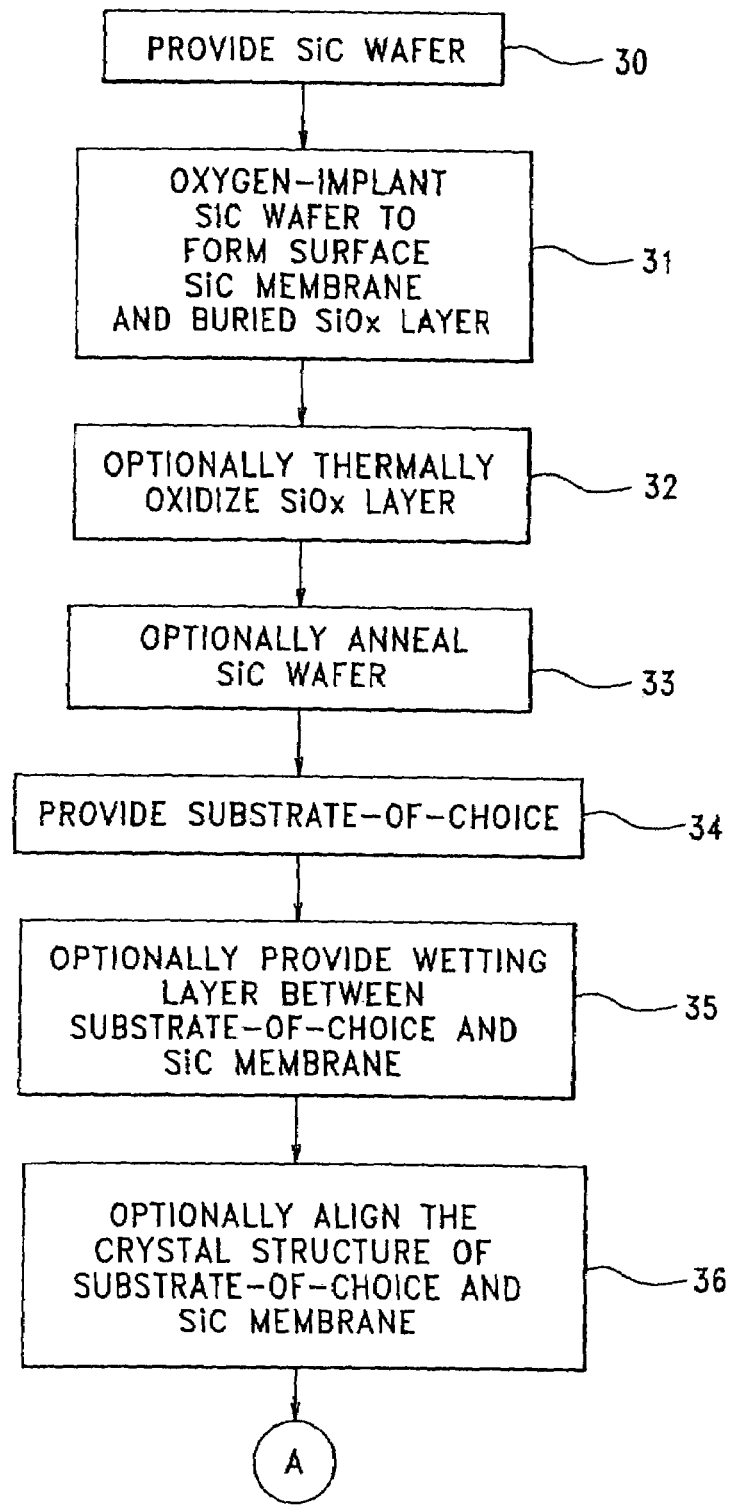
FIGS. 3A and 3B show a method in accordance with the invention.
Figure 3B:
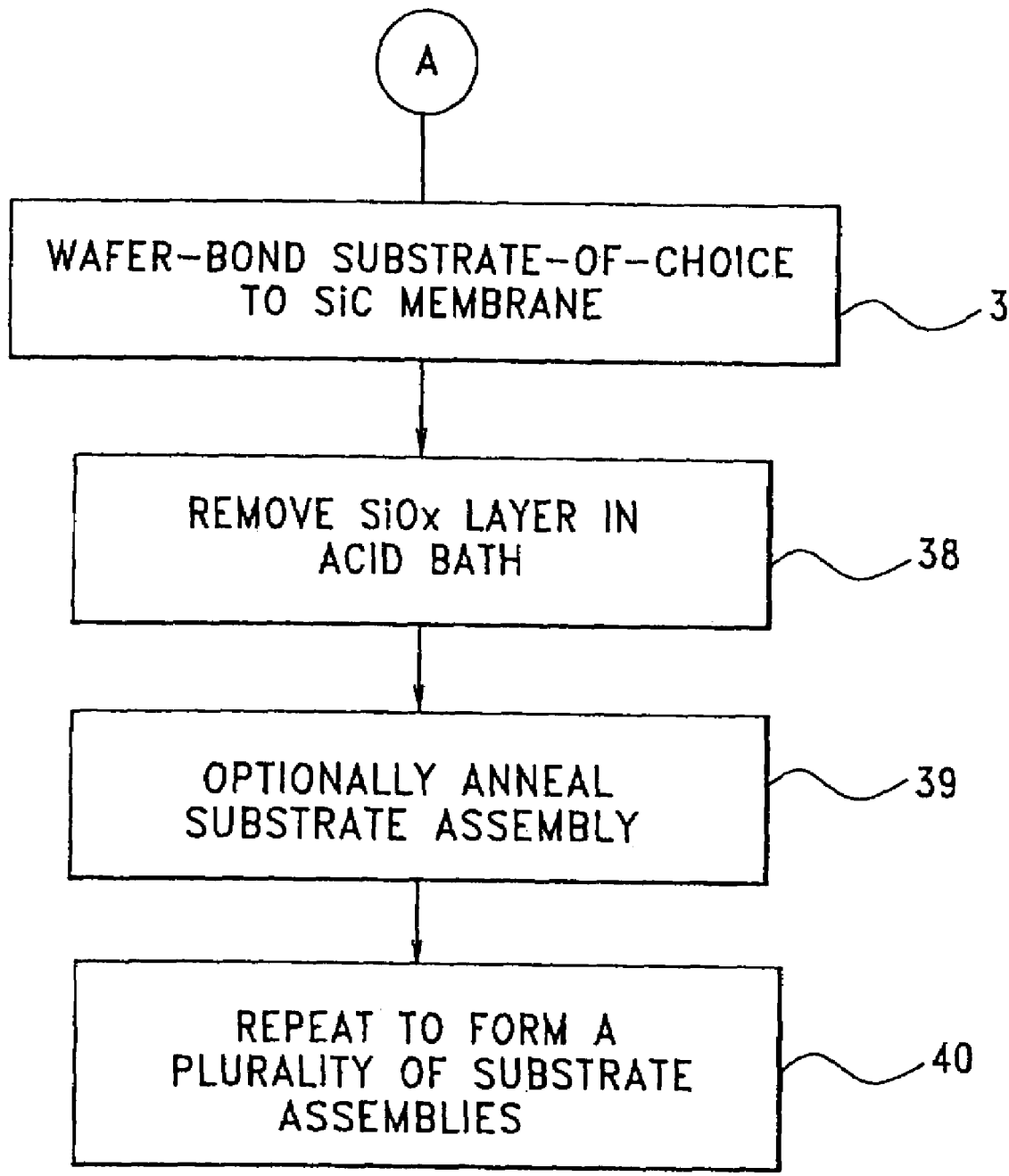

FIGS. 3A and 3B show a method in accordance with the invention wherein in step 30 SiC wafer 11 is provided, and in step 31 SiC wafer 11 is subjected to an oxygen-implantation step to thereby form a surface located SiC membrane 12 that is located on top of a buried SiO$_2$ layer 10.

Step 32 is an optional thermal-oxidation step that may be provided to smoothen the interface between buried SiO$_2$ layer 10 and SiC membrane 12.

Step 33 provides an optional step whereby wafer 11 and its buried SiO$_2$ layer 10 are high-temperature annealed.

Step 34 provides a substrate of choice 13, whereas step 35 optionally provides a wetting layer 15 that contains Si and is located intermediate substrate-of-choice 13 and SiC membrane 12.

Wafers 11 and substrates of choice 13 of the type that are used in accordance with this invention usually include visual indicators, for example flats or cuts, that indicate the alignment direction of the crystals that form members 13 and 11. As a feature of the invention, an optional step 36 may be provided to physically align SiC membrane 12 and substrate-of-choice 13 prior to the above-described wafer-bonding step so as to optimize the bonding of the two crystal interfaces that are provided by the two surfaces that are to be wafer bonded.

In step 37, substrate-of-choice 13 is wafer bonded to SiC membrane 12, and in step 38, the SiO$_2$ layer 10 of FIG. 1B is removed using a hydrofluoric acid bath.

In optional step 39, the FIG. 1C substrate assembly is annealed at a high temperature.

Relative to annealing step-33 and annealing step-39, it may be that the use of only one such step is sufficient. The utility of such a high temperature annealing step, or steps, is to repair any ion implantation induced damage that may be present within SiC membrane 12.

In step 40, the method of FIGS. 3A and 3B is repeated a number of times in order to maximize the use of the thickness of SiC wafer 11, and in order to produce a plurality of the FIG. 1C hybrid substrates, each hybrid substrate including a substrate-of-choice 13 that is wafer bonded to a SiC membrane 12.

The invention has been described in detail while making reference to preferred embodiments thereof. However, this detailed description is not to be taken as a limitation on the spirit and scope of the invention.

What is claimed is:

1. A method of making a hybrid substrate assembly comprising:
   implanting a preferential etching layer within a wafer to thereby form a membrane on a surface of the wafer, the preferential etching layer being located interiorly of at least first and second opposing surfaces of the wafer and the membrane being located between the preferential etching layer and the first surface of the wafer, having a different chemical composition than the preferential etching layer, and being more resistant to etching by a selected etchant than the preferential etching layer;
   permanently attaching a substrate-of-choice to the membrane; and
   etching the preferential etching layer with the selected etchant to separate the membrane from a remainder of the wafer and thereby provide a hybrid substrate assembly that includes the substrate-of-choice permanently attached to the membrane, wherein the wafer is less susceptible to the etchant than the preferential etching layer.

2. The method of claim 1, wherein the preferential etching layer is an oxide layer.

3. The method of claim 1, wherein the wafer is a semiconductor.

4. The method of claim 1, wherein the substrate-of-choice is wafer bonded to the membrane.

5. The method of claim 1, wherein the etching step removes at least substantially the preferential etching layer from the substrate-of-choice and the membrane and including the step of:
   aligning a crystalline construction of the substrate-of-choice to a crystalline construction of the membrane before the permanently attaching step.

6. The method of claim 1, further comprising:
   providing a wetting layer intermediate the substrate-of-choice and the membrane, the wetting layer having an element that is common to the compositions of the wafer and substrate-of-choice.

7. The method of claim 1, further comprising:
   thermally oxidizing the preferential etching layer before the permanently attaching step, wherein a temperature of the oxidizing step is greater than a temperature of the implanting steps, wherein the temperature of the oxidizing step is at least about 600 C, and wherein the thermal oxidation occurs in a molecular oxygen-containing atmosphere.

8. The method of claim 1, wherein the implanting and etching steps respectively comprise an oxygen-implantation step and an acid-etching step.

9. The method of claim 1, further comprising:
   providing a wetting layer intermediate the substrate-of-choice and the membrane before the permanently attaching step.

10. The method of claim 1, further comprising:
    heating the membrane in a molecular oxygen-containing atmosphere, wherein a temperature of the heating step is greater than a temperature of the implanting step, wherein the heating step occurs after the implanting step and before the etching step, and wherein the temperature of the heating step is at least about 600 C.

11. The method of claim 1, wherein an etchant is used in the etching step and the wafer is resistant to the etchant while the preferential etching layer is susceptible to the etchant and further comprising:
    repeating the implanting step, the permanently attaching step, and the etching step a plurality of times relative to the plurality of substrates-of-choice, to thereby provide a plurality of hybrid substrate assemblies that each include a substrate-of-choice wafer bonded to a membrane.

12. The method of claim 1, wherein the wafer is selected from the group consisting essentially of 6H—SiC, 4H—SiC, 3C—SiC, 15R—SiC, and combinations thereof.

13. The method of claim 1, wherein the substrate-of-choice is selected from the group consisting essentially of silicon, silicon dioxide, silicon carbide, sapphire, aluminum nitride, diamond, $Si_3N_4$, and combinations thereof.

14. The method of claim 1, wherein the etchant is hydrofluoric acid.

15. The method of claim 1, wherein the wafer is a semiconductor having a first composition, wherein an oxide layer is implanted within said semiconductor wafer to form the semiconductor membrane on the first surface of the semiconductor wafer, wherein the substrate-of-choice has a second composition that is different than said first composition, wherein the substrate-of-choice is wafer bonded to said semiconductor membrane, wherein the etching step removes at least substantially the oxide layer from the substrate-of-choice and the semiconductor membrane.

16. The method of claim 15, further comprising:
providing a wetting layer intermediate said substrate-of-choice and said semiconductor membrane, said wetting layer having an element that is common to said first composition and said second composition; and
thermally oxidizing said oxide layer prior to said wafer-bonding step, wherein a temperature of the oxidizing step is greater than a temperature of the implanting step and wherein the temperature of the oxidizing step is at least about 600° C., wherein said step of implanting said oxide layer within said semiconductor wafer and said step of etching said oxide layer respectively comprise an oxygen-implantation step and an acid-etching step.

17. The method of claim 15, wherein the semiconductor wafer is resistant to the etchant while the oxide layer is susceptible to the etchant and further comprising:
repeating said implanting step, said permanently attaching step, and said etching step a plurality of times relative to a plurality of substrates-of-choice, to thereby provide a plurality of hybrid substrate assemblies that each include a substrate-of-choice wafer bonded to a semiconductor membrane.

18. The method of claim 15, wherein the wafer is selected from SiC polytypes such as 6H—SiC, 4H—SiC, 3C—SiC and 15R—SiC, the preferential etching layer comprises a $SiO_x$ layer within said wafer, wherein the SiO polytype wafer is resistant to the etchant in the etching step while the $SiO_x$ layer is susceptible to the etchant, and further comprising:
thermally oxidizing said $SiO_x$ layer prior to said etching step, wherein a temperature of the oxidizing step is greater than a temperature of the forming step and the temperature of the oxidizing step is at least about 600° C.; and
providing a wetting layer intermediate said substrate-of-choice and said wafer membrane prior to said wafer-bonding step, wherein said wetting layer contains silicon, wherein the etching step removes at least substantially the $SiO_x$ layer from the substrate-of-choice and the wafer membrane, wherein said substrate-of-choice is selected from a group including Si, $SiO_2$, polycrystalline SiC, sapphire, polycrystalline AlN, crystalline AlN, diamond and $Si_3N_4$ and wherein an etchant is used in said etching step comprises etching said $SiO_x$ layer in hydrofluoric acid.

19. The method of claim 15 wherein said wafer membrane is one micrometer thick or less.

20. The method of claim 18, further comprising:
determining a crystalline structure of said SiC wafer and a crystalline structure of said substrate-of-choice; and
physically aligning said crystalline structure of said SiC membrane to said crystalline structure of said SiC wafer prior to said wafer-bonding step.

* * * * *